US011263362B2

(12) United States Patent
Sun et al.

(10) Patent No.: US 11,263,362 B2
(45) Date of Patent: Mar. 1, 2022

(54) CORRELATION OF MULTIPLE WELLS USING SUBSURFACE REPRESENTATION

(71) Applicant: Chevron U.S.A. Inc., San Ramon, CA (US)

(72) Inventors: Tao Sun, Missouri City, TX (US); Brett M. Hern, Porter, CA (US); Brian Willis, Houston, CA (US); Fabien J. Laugier, Houston, TX (US); Maisha Lara Amaru, Houston, TX (US); Ashley D. Harris, Houston, CA (US); Morgan David Sullivan, Spring, TX (US)

(73) Assignee: Chevron U.S.A. Inc., San Ramon, CA (US)

( * ) Notice: Subject to any disclaimer, the term of this patent is extended or adjusted under 35 U.S.C. 154(b) by 175 days.

(21) Appl. No.: 16/744,992

(22) Filed: Jan. 16, 2020

(65) Prior Publication Data
US 2021/0222523 A1  Jul. 22, 2021

(51) Int. Cl.
*G06F 30/13* (2020.01)
*E21B 41/00* (2006.01)

(52) U.S. Cl.
CPC .......... *G06F 30/13* (2020.01); *E21B 41/0092* (2013.01); *E21B 2200/20* (2020.05)

(58) Field of Classification Search
CPC ...... G06F 30/13; G06F 30/00; E21B 41/0092; E21B 2200/20; E21B 33/08
USPC ....................................................... 703/10, 6
See application file for complete search history.

(56) References Cited

U.S. PATENT DOCUMENTS

| 2,653,220 A | 9/1953 | Bays |
| 7,079,953 B2 | 7/2006 | Thorne |
| 7,516,055 B2 | 4/2009 | Strebelle |
| 7,630,517 B2* | 12/2009 | Mirowski ............ G01V 11/00 382/109 |
| 7,706,981 B2 | 4/2010 | Wilkinson |
| 8,271,244 B2 | 9/2012 | Ross |

(Continued)

FOREIGN PATENT DOCUMENTS

| CN | 102540256 | 7/2012 |
| CN | 103454678 | 12/2013 |

(Continued)

OTHER PUBLICATIONS

Bertoncello, Antoine et al., "Geostatistics on Stratigraphic Grids", 2008, Geostats, VIII International Geostatistics Congress. (Year: 2008).*

(Continued)

*Primary Examiner* — Cedric Johnson
(74) *Attorney, Agent, or Firm* — Esplin & Associates, PC

(57) ABSTRACT

A subsurface representation may define simulated subsurface configuration of a simulated subsurface region. The simulated subsurface region may include simulated wells, and the simulated subsurface configuration may define simulated correlation between the simulated wells. Subsurface configuration of wells may be compared with the simulated subsurface configuration to generate similarity maps for the wells. Simulated wells may be matched to the wells based on the similarity maps and the arrangement of the wells. Correlation between the wells may be determined based on the simulated correlation between the matched simulated wells.

20 Claims, 8 Drawing Sheets

(56) References Cited

U.S. PATENT DOCUMENTS

| | | |
|---|---|---|
| 8,666,149 B2 | 3/2014 | Thorne |
| 9,187,984 B2 | 11/2015 | Usadi |
| 9,753,180 B2 | 9/2017 | Suzuki |
| 9,804,282 B2 | 10/2017 | Xu |
| 10,036,829 B2 | 7/2018 | Ghayour |
| 10,190,403 B2 | 1/2019 | Samuel |
| 10,287,858 B2 | 5/2019 | Ghayour |
| 10,317,569 B2 | 6/2019 | Sun |
| 10,319,143 B2 | 6/2019 | Branets |
| 10,365,261 B2 | 7/2019 | Montgomery |
| 10,816,440 B2 | 10/2020 | Amendt |
| 10,984,590 B1 | 4/2021 | Li |
| 11,010,969 B1 | 5/2021 | Li |
| 2002/0013687 A1 | 1/2002 | Ortoleva |
| 2005/0180261 A1 | 8/2005 | Mandal |
| 2006/0041409 A1 | 2/2006 | Strebelle |
| 2006/0052938 A1 | 3/2006 | Thorne |
| 2006/0136162 A1 | 6/2006 | Hamman |
| 2007/0100593 A1 | 5/2007 | Deffenbaugh |
| 2007/0219724 A1 | 9/2007 | Li |
| 2008/0015784 A1 | 1/2008 | Dorn |
| 2009/0262603 A1 | 10/2009 | Hurley |
| 2009/0306945 A1 | 12/2009 | Wu |
| 2009/0319243 A1 | 12/2009 | Suarez-Rivera |
| 2010/0149917 A1 | 6/2010 | Imhof |
| 2010/0332205 A1 | 12/2010 | Tillier |
| 2011/0002194 A1 | 1/2011 | Imhof |
| 2011/0054857 A1 | 3/2011 | Moguchaya |
| 2011/0054869 A1 | 3/2011 | Li |
| 2011/0213600 A1 | 9/2011 | Strebelle |
| 2011/0231164 A1 | 9/2011 | Zhang |
| 2011/0240310 A1 | 10/2011 | Sun |
| 2011/0264430 A1 | 10/2011 | Tapscott |
| 2011/0272161 A1 | 11/2011 | Kumaran |
| 2012/0029828 A1 | 2/2012 | Pepper |
| 2012/0215628 A1* | 8/2012 | Williams ............... E21B 47/06 705/14.49 |
| 2012/0221302 A1 | 8/2012 | Lewandowski |
| 2012/0221306 A1 | 8/2012 | Hurley |
| 2013/0046524 A1 | 2/2013 | Gathogo |
| 2013/0064040 A1 | 3/2013 | Imhof |
| 2013/0118736 A1 | 5/2013 | Usadi |
| 2013/0151161 A1 | 6/2013 | Imhof |
| 2013/0179080 A1 | 7/2013 | Skalinski |
| 2013/0246031 A1 | 9/2013 | Wu |
| 2013/0294197 A1 | 11/2013 | Vallikkat Thachaparambil |
| 2013/0318141 A1 | 11/2013 | Maucec |
| 2013/0329986 A1 | 12/2013 | Strebelle |
| 2014/0035912 A1 | 2/2014 | Julian |
| 2014/0316706 A1 | 10/2014 | Grant |
| 2014/0358440 A1 | 12/2014 | Pyrcz |
| 2015/0066460 A1 | 3/2015 | Klinger |
| 2015/0088424 A1 | 3/2015 | Burlakov |
| 2015/0112656 A1 | 4/2015 | Rodriguez-Herrera |
| 2015/0212231 A1 | 7/2015 | Borouchaki |
| 2015/0219793 A1 | 8/2015 | Li |
| 2015/0241591 A1* | 8/2015 | Burmester ............... G06K 9/64 702/7 |
| 2015/0309197 A1 | 10/2015 | Dimitrov |
| 2016/0041279 A1 | 2/2016 | Casey |
| 2016/0048933 A1 | 2/2016 | Strebelle |
| 2016/0103245 A1 | 4/2016 | Pyrcz |
| 2016/0139299 A1 | 5/2016 | Leger |
| 2016/0313463 A1 | 10/2016 | Wahrmund |
| 2016/0342718 A1 | 11/2016 | Moyner |
| 2017/0011149 A1 | 1/2017 | Liu |
| 2017/0153343 A1 | 6/2017 | Almarhoon |
| 2017/0205531 A1 | 7/2017 | Berard |
| 2017/0227451 A1* | 8/2017 | Hoegerl ............... G01N 17/04 |
| 2018/0003839 A1 | 1/2018 | Lowell |
| 2018/0217283 A1 | 8/2018 | Klinger |
| 2018/0225778 A1* | 8/2018 | Grant ............... G06Q 10/06395 |
| 2018/0334902 A1 | 11/2018 | Olsen |
| 2019/0026405 A1 | 1/2019 | Ramsay |
| 2019/0094414 A1 | 3/2019 | Prochnow |
| 2019/0243028 A1 | 8/2019 | Von Gonten |
| 2020/0380390 A1 | 12/2020 | Sun |
| 2021/0048556 A1 | 2/2021 | Sun |
| 2021/0173117 A1 | 6/2021 | Laugier |
| 2021/0223431 A1 | 7/2021 | Hern |
| 2021/0302620 A1 | 9/2021 | Hern |

FOREIGN PATENT DOCUMENTS

| | | |
|---|---|---|
| CN | 103454686 | 12/2013 |
| CN | 104111473 | 10/2014 |
| CN | 105372705 | 3/2016 |
| CN | 105717542 | 6/2016 |
| CN | 105954802 | 9/2016 |
| CN | 107942382 | 4/2018 |
| CN | 107976713 | 5/2018 |
| EP | 2917770 | 9/2015 |
| FR | 3039679 | 2/2017 |
| GB | 2474740 | 4/2011 |
| WO | 2017019718 | 2/2017 |
| WO | 2018208634 | 11/2018 |

OTHER PUBLICATIONS

Michelena, Reinaldo J. et al., "Similarity Analysis: A New Tool to Summarize Seismic Attributes Information", Apr. 1998, The Leading Edge. (Year: 1998).*

One Petro Search Results, Jun. 15, 2021, 8 pp. (Year: 2021).

Scheevel et al., Principal Component Analysis Applied to 3D Seismic Data for Reservoir Property Estimation, Feb. 1, 2001, SPE Reservoir Evaluation & Engineering 4 (01), pp. 64-72 (Year: 2001).

PCT International Search Report and Written Opinion for Application No. PCT/US21/23008, dated Jun. 8, 2021 (8 pages).

Ana-Maria Ilisei et al., Automatic Classification of Subsurface Features in Radar Sounder Data Acquired in Icy Areas, 2013, IEEE, pp. 3530-3533 (Year: 2013).

Liu et al. "Visual Analytics of Stratigraphic Correlation for Multi-attribute Well-logging Data Exploration." Jul. 2019 IEEE Access PP(99):1-1, Jul. 16, 2019, [online] [retrieved on Oct. 5, 2020 (Oct. 5, 2020)) Retrieved from the Internet< URL: https://ieeexplore.ieee.org/document/8764395>. entire document (13 pages).

PCT International Search Report and Written Opinion, International Application No. PCT/US20/44874, dated Dec. 17, 2020. (8 pages).

PCT International Search Report and Written Opinion, International Application No. PCT/US20/61212, dated Dec. 21, 2020. (7 pages).

PCT International Search Report and Written Opinion, International Application No. PCT/US20/31869, dated Aug. 4, 2020. 2 pages.

Efros, A. A., & Freeman, W. T. (2001). Image quilting for texture synthesis and transfer. Proceedings of the 28th Annual Conference on Computer Graphics and Interactive Techniques—SIGGRAPH '01, 341-346. https://doi.org/10.1145/383259.383296.

Hoffimann, J., Scheidt, C., Barfod, A., & Caers, J. (2017). Stochastic simulation by image quilting of process-based geological models. Computers and Geosciences, 106(February), 18-32. https://doi.org/10.1016/j.cageo.2017.05.012.

Mariethoz, G., Renard, P., & Straubhaar, J. (2010). The direct sampling method to perform multiplepoint geostatistical simulations. Water Resources Research, 46(11). https://doi.org/10.1029/2008WR007621.

Mahmud, K., Mariethoz, G., Caers, J., Tahmasebi, P., & Baker, A. (2014). Simulation of Earth textures by conditional image quilting. Water Resources Research, 50(4), 3088-3107. https://doi.org/10.1002/2013WR015069.

Bertoncello, Antoine , Caers, Jef, Biver, Pierre, CaumonGuillaume, (2008). Geostatistics on Stratigraphic Grid. ERE department / Stanford University (pp. 1-16).

Harris S, Santoshini S, Kashem S, Viard T, Levannier A, Benabbou A. Complex geological modeling and quality assurance using unstructured grids. InAbu Dhabi International Petroleum Exhibition & Conference Nov. 12, 2018. Society of Petroleum Engineers. 20 pages.

Rubio, R.H., Koppe, V.C., Costa, J.F.C.L. and Cherchenevski, P.K., 2015. How the use of stratigraphic coordinates improves grade estimation. Rem: Revista Escola de Minas, 68(4), pp. 471-477.

(56) References Cited

OTHER PUBLICATIONS

Santoshini S, Harris S, Kashem S, Levannier A, Benabbou A, Viard T, Mace L. Depogrid: Next Generation Unstructured Grids for Accurate Reservoir Modeling and Simulation. InSPE Russian Petroleum Technology Conference Oct. 15, 2018. Society of Petroleum Engineers. 20 pages.

PCT International Search Report and Written Opinion, International Application No. PCT/US2020/61489, dated Jan. 28, 2021 (7 pages).

PCT International Search Report and Written Opinion, International Application No. PCT/US2020/61323, dated Feb. 19, 2021 (8 pages).

PCT International Search Report and Written Opinion, International Application No. PCT/US21/12733, dated Mar. 23, 2021 (11 pages).

Tahmasebi et al. Multiple-point geostatistical modeling based on the cross-correlation 1-15 functions. Mar. 8, 2012 (Mar. 8, 2012). [retrieved on Mar. 5, 2021]. Retrieved from the Internet: <URL: http:/lwww.uwyo.edu/pejman/_files/docs/tahmasebi_ccsim.pdf> pp. 779-796.

Zhou et al. A Stratigraphic Prediction Method Based on Machine Learning. Aug. 29, 2019 1-15 (Aug. 29, 2019). (retrieved on Mar. 3, 2021]. Retrieved from the Internet: <URL: https://www.mdpi.com/2076-3417/9/17/3553/pdf> pp. 1-29.

Zhou et al. A Stratigraphic Prediction Method Based on Machine Learning. Aug. 29, 2019 (Aug. 29, 2019). [retrieved on Mar. 5, 2021]. Retrieved from the Internet: <URL: https://www.mdpi.com/2076-3417/9/17/3553/pdf> pp. 1-29.

Hawie, Nicolas, Jacob Covault, Dallas Dunlap, and Zoltan Sylvester 2017. "Slope-fan Depositional Architecture from High-resolution Forward Stratigraphic Models". EarthArXiv. Dec. 19. eartharxiv.org/f9dkp. (36 pages).

Yupeng, Li, and Wu Shenghe. "Hierarchical nested simulation approach in reservoir architecture modeling." Petroleum Exploration and Development 40, No. 5 (2013): 676-681.

Sacchi, Quinto, Eloisa Salina Borello, Gert Jan Weltje, and Rory Dalman. "Increasing the predictive power of geostatistical reservoir models by integration of geological constraints from stratigraphic forward modeling." Marine and Petroleum Geology 69 (2016): 112-126.

PCT International Search Report and Written Opnion for Application No. PCT/US21/29956, dated Aug. 2, 2021 (7 pages).

Ou et al. "Fine reservoir structure modeling based upon 3D visualized stratigraphic correlation between horizontal wells: methodology and its application" Journal of Geophysics and Engineering J. Geophys Eng. 14 (2017) 1557-1571 (15pp). (Year: 2017).

Weltje, Gert Jan, Rory Dalman, Pantelis Karamitopoulos, and Quinto Sacchi. "Reducing the uncertainty ofstatic reservoir models: implementation of basin-scale geological constraints." In EAGE Annual Conference & Exhibitionincorporating SPE Europec. OnePetro, 2013 (Year: 2013).

Chandra, Viswasanthi, Patrick William Michael Corbett, Sebastian Geiger, and Hamidreza Hamdi. Improving reservoir characterization and simulation with near-wellbore modeling. SPE Reservoir Evaluation & Engineering 16, No. 02 (2013): 183-193 (Year: 2013).

Dalman, Rory AF, and Gert Jan Weltje. SimClast: An aggregated forward stratigraphic model of continental shelves. Computers & geosciences 38, No. 1 (2012): 115-126 (Year: 2012).

Amaru, Maisha, Tao Sun, Lisa Goggin, and Ashley Harris. "Integration of computational stratigraphy models and seismic data for subsurface characterization." The Leading Edge 36, No. 11 (2017): 947a1-947a6 (Year: 2017).

Hantschel, Thomas, and Armin I. Kauerauf. Fundamentals of basin and petroleum systems modeling. Section 8.9. Springer Science & Business Media, 2009, pp. 399-404 (Year: 2009).

Hawie, N., M. Callies, and E. Marfisi. "Integrated Multi-Disciplinary Forward Stratigraphic Modelling Workflow in Petroleum Systems Assessment." In SPE Middle East Oil & Gas Show and Conference OnePetro, 2017. 8 pages (Year: 2017).

* cited by examiner

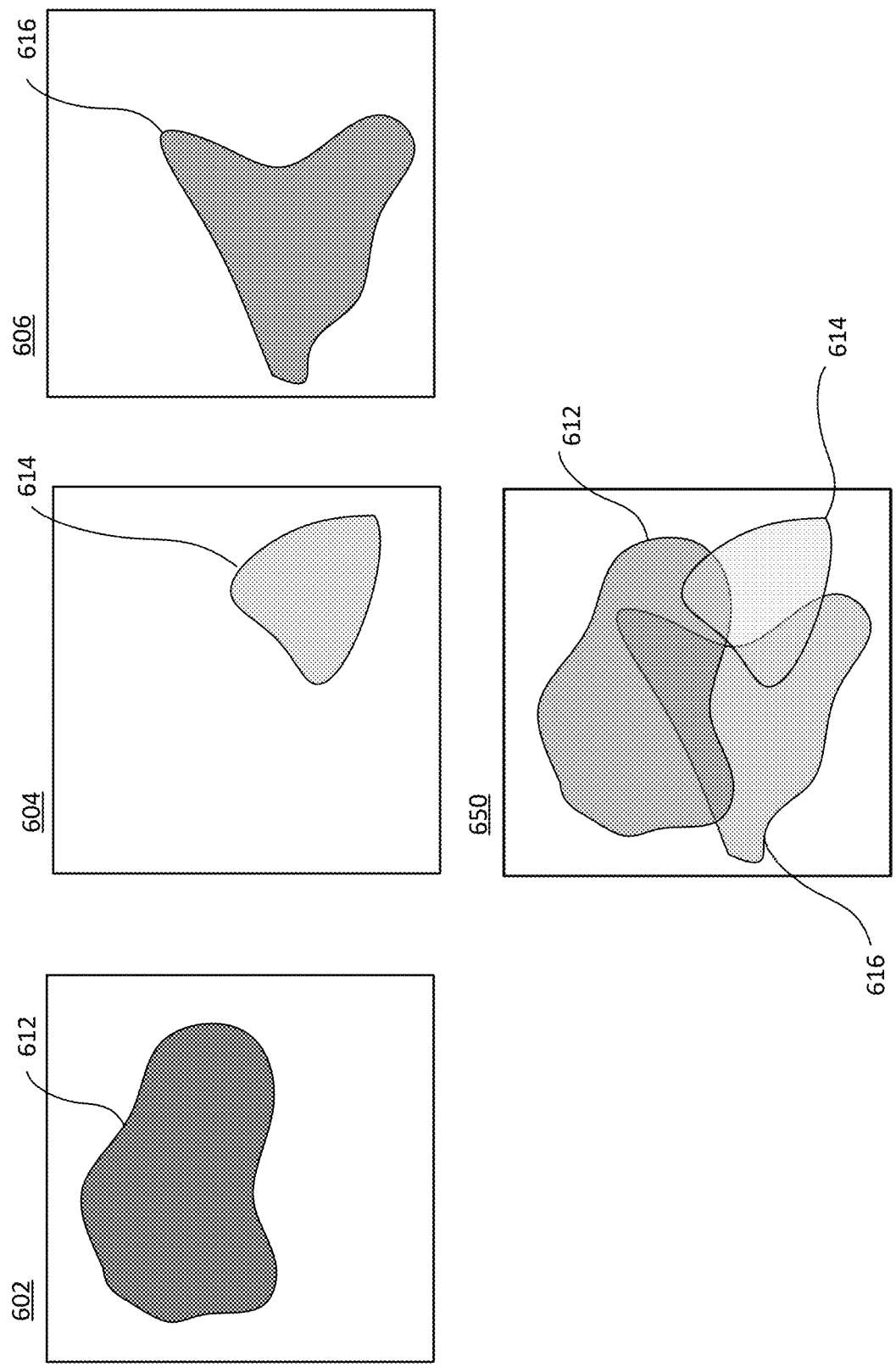

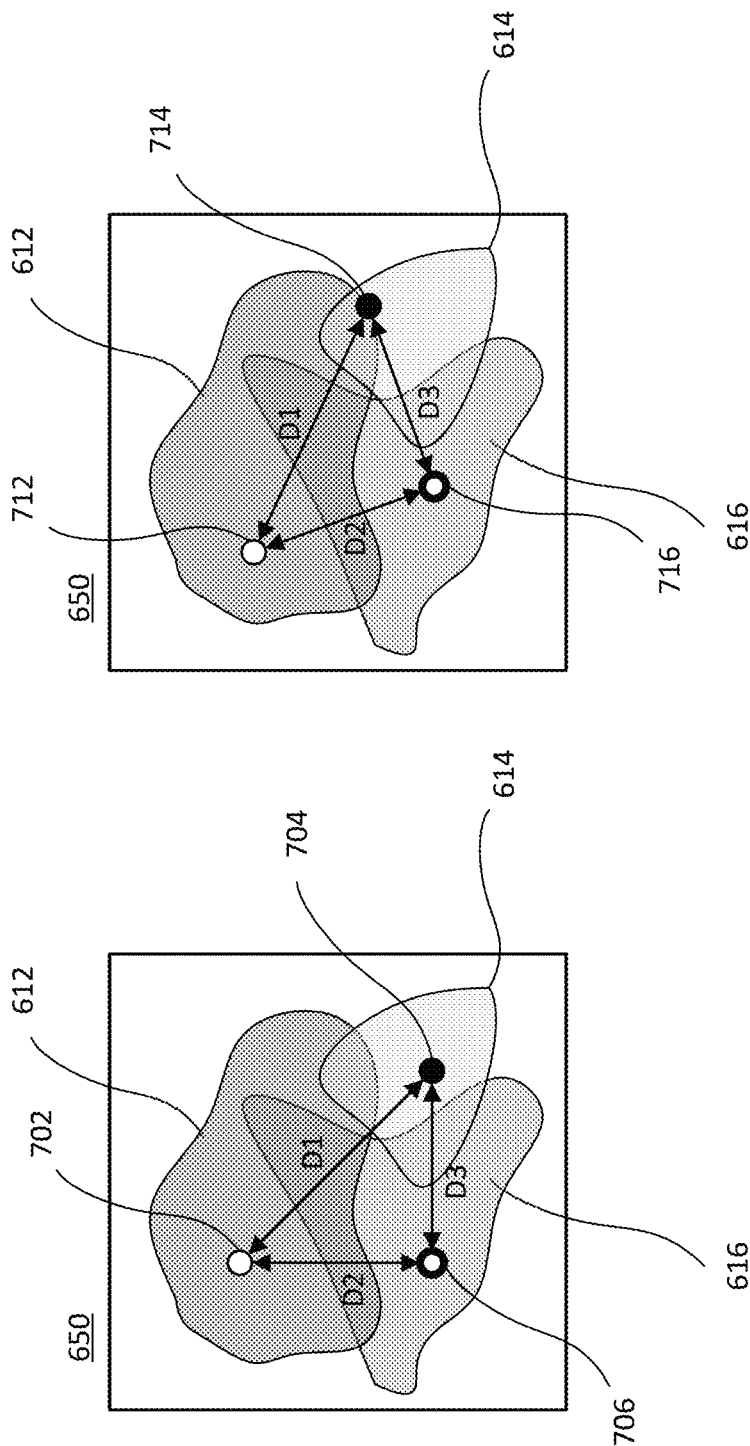

CORRELATION OF MULTIPLE WELLS USING SUBSURFACE REPRESENTATION

FIELD

The present disclosure relates generally to the field of correlating multiple wells using subsurface representations.

BACKGROUND

Correlation of different wells using well logs and/or well cores may provide insights on whether and/or how different segments of the wells are linked together. Lithostratigraphic correlations of wells may result in erroneous representations of the spatial distributions of rock properties and/or internal structure of a reservoir.

SUMMARY

This disclosure relates to correlating multiple wells. Subsurface representation information, well information, and/or other information may be obtained. The subsurface representation information may define one or more subsurface representations. A subsurface representation may define simulated subsurface configuration of a simulated subsurface region including simulated wells. The simulated wells may include a first simulated well, a second simulated well, and/or other simulated wells. The simulated subsurface configuration of the simulated subsurface region may define simulated correlation between the simulated wells such that the simulated subsurface configuration of the simulated subsurface region defines simulated correlation between the first simulated well and the second simulated well. The well information may define subsurface configuration of wells and spatial arrangement of the wells. The wells may include a first well, a second well, and/or other wells. The spatial arrangement of the first well and the second well may include the first well separated from the second well by a distance.

Similarity maps for the wells may be generated based on comparison of the subsurface configuration of the wells with the simulated subsurface configuration of the simulated subsurface region and/or other information. Individual similarity maps may characterize extent of similarity between individual ones of the wells and different locations within the simulated subsurface region. The similarity maps may include a first similarity map for the first well, a second similarity map for the second well, and/or other similarity maps for other wells.

One or more groupings of matched simulated wells within the simulated subsurface region may be identified based on the similarity maps, the spatial arrangement of the wells, and/or other information. Individual groupings of matched simulated wells may include a matched simulated well for individual ones of the wells. The grouping(s) of matched simulated wells may include a first grouping of matched simulated wells and/or other groupings of matched simulated wells. The first grouping of matched simulated wells may include the first simulated well matched to the first well, the second simulated well matched to the second well, and/or other simulated wells matched to other wells.

Correlation between the wells may be determined based on the simulated correlation between the matched simulated wells and/or other information. Correlation between the first well and the second well may be determined based on the simulated correlation between the first simulated well and the second simulated well, and/or other information.

A system that correlates multiple wells may include one or more electronic storage, one or more processors and/or other components. The electronic storage may store subsurface representation information, information relating to subsurface representation, information relating to simulated subsurface configuration, information relating to simulated subsurface region, information relating to simulated well, well information, information relating wells, information relating to subsurface configuration of wells, information relating to spatial arrangement of wells, information relating to similarity maps, information relating to matched simulated wells, information relating to correlation between wells, and/or other information.

The processor(s) may be configured by machine-readable instructions. Executing the machine-readable instructions may cause the processor(s) to facilitate correlating multiple wells. The machine-readable instructions may include one or more computer program components. The computer program components may include one or more of a subsurface representation component, a well component, a similarity map component, a matched simulated well component, a correlation component, and/or other computer program components.

The subsurface representation component may be configured to obtain subsurface representation information and/or other information. The subsurface representation information may define one or more subsurface representations. A subsurface representation may define simulated subsurface configuration of a simulated subsurface region. The simulated subsurface region may include simulated wells. The simulated wells may include a first simulated well, a second simulated well, and/or other simulated wells. The simulated subsurface configuration of the simulated subsurface region may define simulated correlation between the simulated wells such that the simulated subsurface configuration of the simulated subsurface region defines simulated correlation between the first simulated well and the second simulated well.

In some implementations, a subsurface representation may be scaled in area size and thickness to match a subsurface region of interest.

In some implementations, a subsurface representation may include a computational stratigraphy model representation, and the correlation between the wells may include chrono-sequence stratigraphic correlation.

In some implementations, the subsurface representation information may define multiple subsurface representations. Individual ones of the subsurface representations may be used to provide separate set of correlation between the wells.

The well component may be configured to obtain well information and/or other information. The well information may define subsurface configuration of wells and spatial arrangement of the wells. The wells may include a first well, a second well, and/or other wells. The spatial arrangement of the first well and the second well may include the first well separated from the second well by a distance. In some implementations, the wells may include more than two wells, and the spatial arrangement of the wells may include relative positions of the wells.

The similarity map component may be configured to generate similarity maps for the wells. The similarity maps may be generated based on comparison of the subsurface configuration of the wells with the simulated subsurface configuration of the simulated subsurface region, and/or other information. Individual similarity maps may characterize extent of similarity between individual ones of the wells and different locations within the simulated subsurface region. The similarity maps may include a first similarity map for the first well, a second similarity map for the second well, and/or other similarity maps for other wells.

The matched simulated well component may be configured to identify one or more groupings of matched simulated wells within the simulated subsurface region. The grouping(s) of matched simulated wells within the simulated subsurface region may be identified based on the similarity maps, the spatial arrangement of the wells, and/or other information. Individual groupings may include a matched simulated well for individual ones of the wells. The grouping(s) of matched simulated wells may include a first grouping of matched simulated wells and/or other groupings of matched simulated wells. The first grouping of matched simulated wells may include the first simulated well matched to the first well, the second simulated well matched to the second well, and/or other simulated wells matched to other wells.

In some implementations, the grouping(s) of matched simulated wells may be identified based on the relative positions of the wells and/or other information.

In some implementations, identification of the grouping(s) of matched simulated wells within the simulated subsurface region based on the similarity maps and the spatial arrangement of the wells may include determination of portions of the similarity maps within which the matched simulated wells are identified. The portions of the similarity maps within which the matched simulated wells are identified may be determined based on thresholding of the extent of similarity between the individual ones of the wells and the different locations within the simulated subsurface region, and/or other information. The portions of similarity maps may include a first portion of the first similarity map, a second portion of the second similarity map, and/or other portions of other similarity maps.

In some implementations, the first simulated well may be located within the first portion of the first similarity map and the second simulated well may be located within the second portion of the second similarity map. A simulated distance between the first simulated well and the second simulate well may match the distance between the first well and the second well. In some implementations, the simulated distance may match the distance based on the simulated distance being within a tolerance distance of the distance.

In some implementations, multiple groupings of matched simulated wells may be identified within the simulated subsurface region. Individual grouping of matched simulated wells may provide a scenario of correlation between the wells.

In some implementations, matching quality of individual grouping of matched simulated wells may be determined based on extent of matching of the matched simulated wells with corresponding wells, extent of matching of simulated spatial arrangement of the matched simulated wells with the spatial arrangement of the wells, and/or other information.

The correlation component may be configured to determine correlation between the wells based on the simulated correlation between the matched simulated wells and/or other information. Correlation between the first well and the second well may be determined based on the simulated correlation between the first simulated well and the second simulated well.

In some implementations, multiple scenarios of correlation between the wells may be provided based on identification of multiple groupings of matched simulated well within the stimulated surface region and/or other information. Individual grouping of matched simulated wells may provide a scenario of correlation between the wells.

In some implementations, separate sets of correlation between the wells may be provided based on the subsurface representation information defining multiple subsurface representations and/or other information. Individual ones of the subsurface representations may be used to provide separate set of correlation between the wells.

These and other objects, features, and characteristics of the system and/or method disclosed herein, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of "a," "an," and "the" include plural referents unless the context clearly dictates otherwise.

BRIEF DESCRIPTION OF THE DRAWINGS

FIG. 6 illustrates example similarity maps.

FIGS. 7A and 7B illustrate example groupings of matched simulated wells.

DETAILED DESCRIPTION

The present disclosure relates to correlating multiple wells. A subsurface representation may define simulated subsurface configuration of a simulated subsurface region. The simulated subsurface region may include simulated wells, and the simulated subsurface configuration may define simulated correlation between the simulated wells. Subsurface configuration of wells may be compared with the simulated subsurface configuration to generate similarity maps for the wells. Simulated wells may be matched to the wells based on the similarity maps and the arrangement of the wells. Correlation between the wells may be determined based on the simulated correlation between the matched simulated wells.

Figure 1:
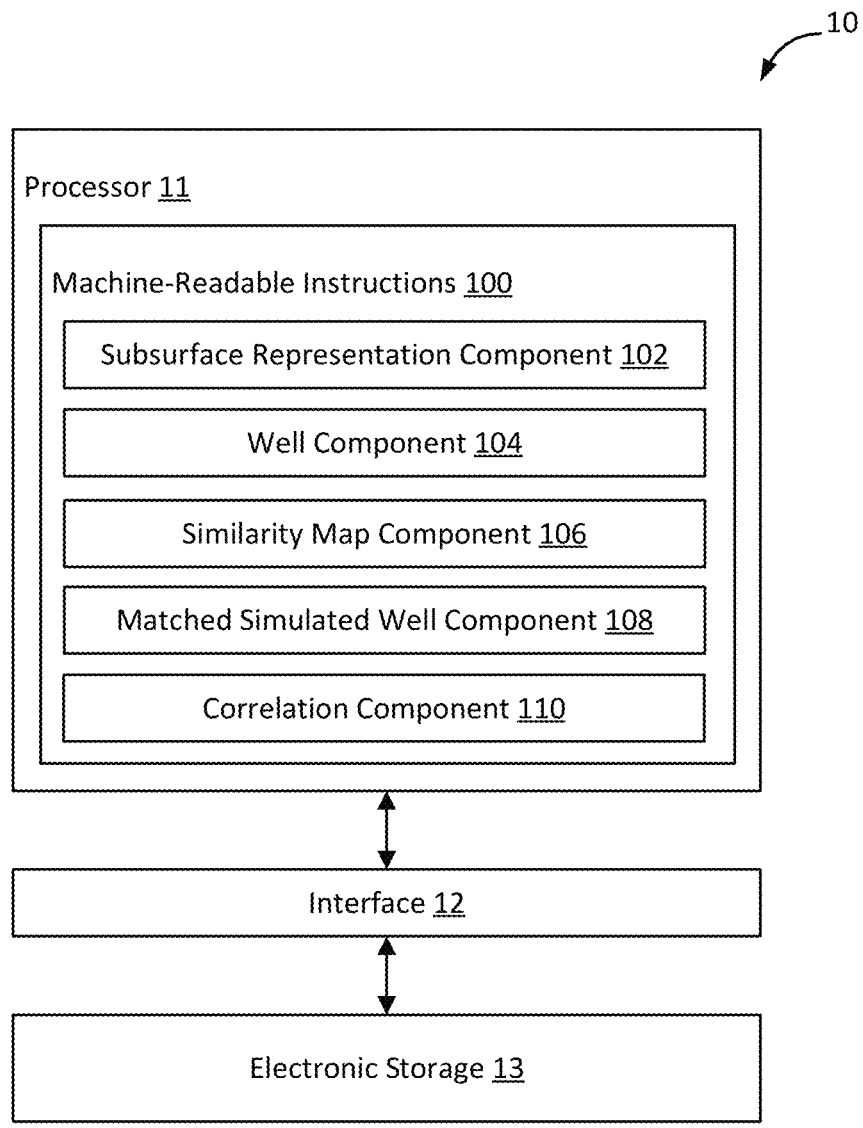
FIG. 1 illustrates an example system that correlates multiple wells.

The methods and systems of the present disclosure may be implemented by and/or in a computing system, such as a system 10 shown in FIG. 1. The system 10 may include one or more of a processor 11, an interface 12 (e.g., bus, wireless interface), an electronic storage 13, and/or other components. Subsurface representation information, well information, and/or other information may be obtained by the processor 11. The subsurface representation information may define one or more subsurface representations. A subsurface representation may define simulated subsurface configuration of a simulated subsurface region including simulated wells. The simulated wells may include a first simulated well, a second simulated well, and/or other simulated wells. The simulated subsurface configuration of the simulated subsurface region may define simulated correlation between the simulated wells such that the simulated subsurface configuration of the simulated subsurface region defines simulated correlation between the first simulated well and the second simulated well. The well information may define subsurface configuration of wells and spatial arrangement of the wells. The wells may include a first well, a second well, and/or other wells. The spatial arrangement of first well and the second well may include the first well separated from the second well by a distance.

Similarity maps for the wells may be generated by the processor 11 based on comparison of the subsurface configuration of the wells with the simulated subsurface configuration of the simulated subsurface region and/or other information. Individual similarity maps may characterize extent of similarity between individual ones of the wells and different locations within the simulated subsurface region. The similarity maps may include a first similarity map for the first well, a second similarity map for the second well, and/or other similarity maps for other wells.

One or more groupings of matched simulated wells within the simulated subsurface region may be identified by the processor 11 based on the similarity maps, the spatial arrangement of the wells, and/or other information. Individual groupings of matched simulated wells may include a matched simulated well for individual ones of the wells. The grouping(s) of matched simulated wells may include a first grouping of matched simulated wells and/or other groupings of matched simulated wells. The first grouping of matched simulated wells may include the first simulated well matched to the first well, the second simulated well matched to the second well, and/or other simulated wells matched to other wells.

Correlation between the wells may be determined by the processor 11 based on the simulated correlation between the matched simulated wells and/or other information. Correlation between the first well and the second well may be determined based on the simulated correlation between the first simulated well and the second simulated well, and/or other information.

A well may refer to a hole or a tunnel in the ground. A well may be drilled in the ground for exploration and/or recovery of natural resources in the ground. For example, a well may be drilled in the ground to aid in extraction of petrochemical fluid (e.g., oil, gas, petroleum, fossil fuel). A well may be drilled in one or more directions. For example, a well may include a vertical well, a horizontal well, a deviated well, and/or other type of well.

A well may expose and/or run through different types of materials (e.g., sedimentary rocks) in the ground. The materials in the ground may be grouped into related packages. For example, rocks in the ground may be grouped into packages of rocks that are bounded by chronostratigraphic surface and/or sequence stratigraphic boundaries. Rocks may be related based on their depositions by the same flow and/or sediment transport event. Because the flow and the associated sediment transport are highly correlated spatially, the spatial distribution and spatial variabilities of the sedimentary rocks that are produced by the flow and sediment transport may be predicted.

Geologic analysis and/or reservoir characterization workflow may include determining correlations between segments of different wells. A segment of a well may refer to a part of the well (e.g., a vertical part of the well). A segment of a well may include and/or be defined by one or more materials within a part of the well (e.g., sedimentary rock within a part of the well). A segment of a well may include and/or be defined by one or more materials surrounding a part of the well (e.g., sedimentary rock surrounding a part of the well). A correlation between segments of wells may refer to connection, correspondence, and/or relationship between a segment of one well correlated to a segment of another well. A segment of one well correlated to a segment of another well may indicate that the two segments were deposited at the same time (chronostratigraphically) and/or have similar/related characteristics.

Correlation of wells may be determined lithostratigraphically. Lithostratigraphic correlation of wells may include correlation of wells based solely on their physical and/or petrographic features. Lithostratigraphic correlation of wells may include correlation of wells that maximize cross correlations between pairs of log signals. That is, lithostratigraphic correlation may correlate wells by looking for similar patterns in the pairs of log signals. For example, segments of different wells may be linked together based on similarity of geo-patterns within the segments. However, such correlation of well segments may erroneously represent spatial distributions of rock properties and/or reservoir internal heterogeneity.

Figure 3A:
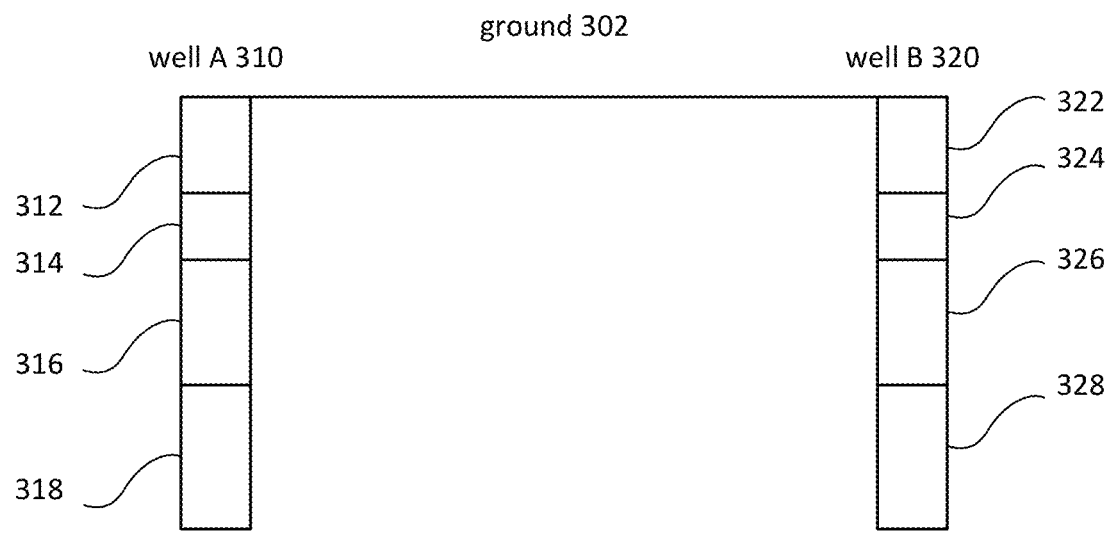
FIGS. 3A-3D illustrate example segments of two wells.
Figure 3B:
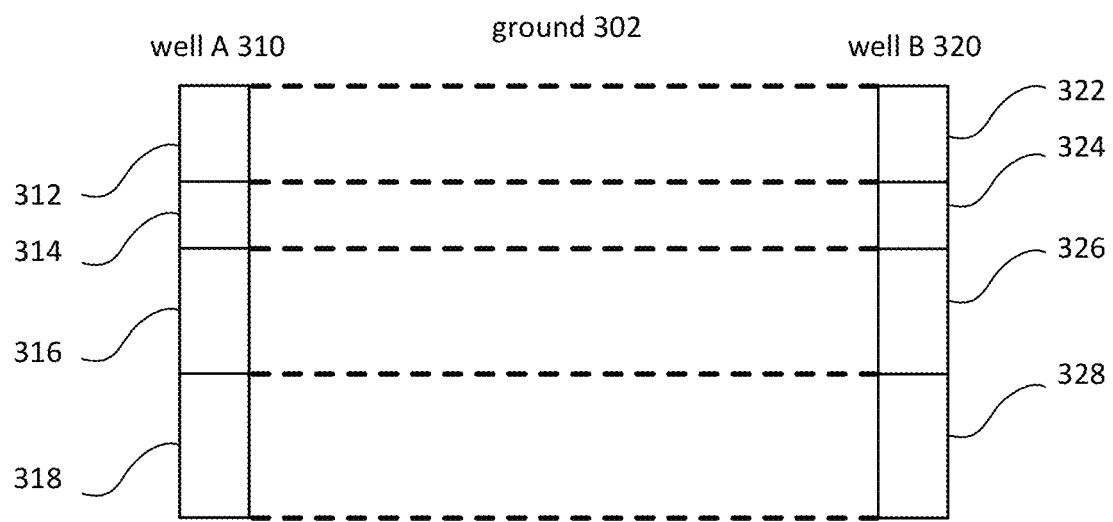

For example, FIGS. 3A-3D illustrate example segments of a well A 310 and a well B 320 drilled into ground 302. The segments of the well A 310 and the well B 320 may include division of the well A 310 and the well B 320 into related packages. The well A 310 may include segments 312, 314, 316, 318, and the well B 320 may include segments 322, 324, 326, 328. As shown in FIG. 3B, lithostratigraphic correlation of segments of wells A 310 and well B 320 may result in linking of the segment 312 to the segment 322, linking of the segment 314 to the segment 324, linking of the segment 316 to the segment 326, and the linking of the segment 318 to the segment 328. Such linking of well segments may result in a railway track style of correlation where the rock packages in the well A 310 is linked to similar rock packages in the well B 320, which may imply that the linked well segments are connected.

Figure 3C:
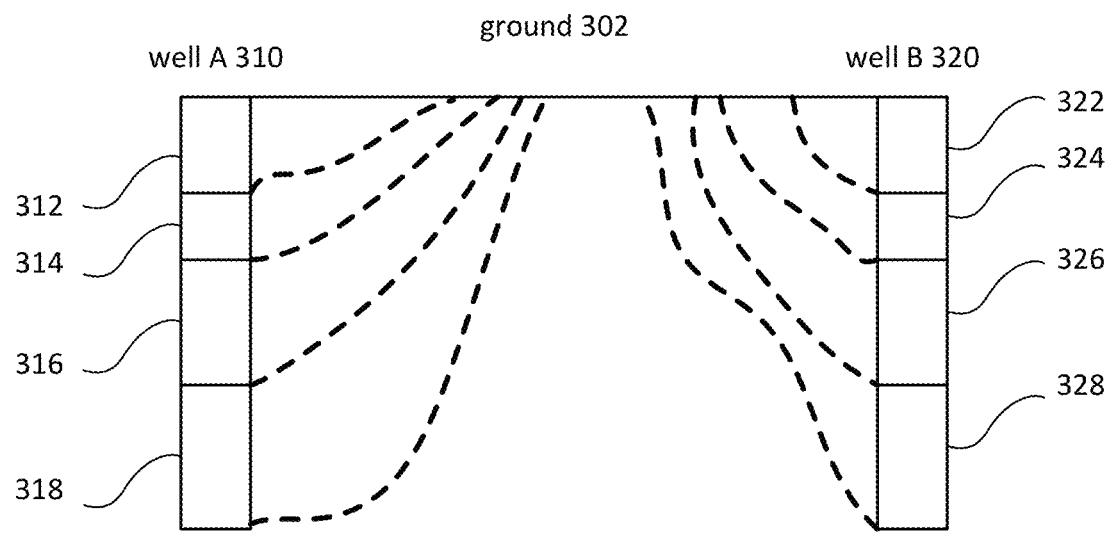
Figure 3D:
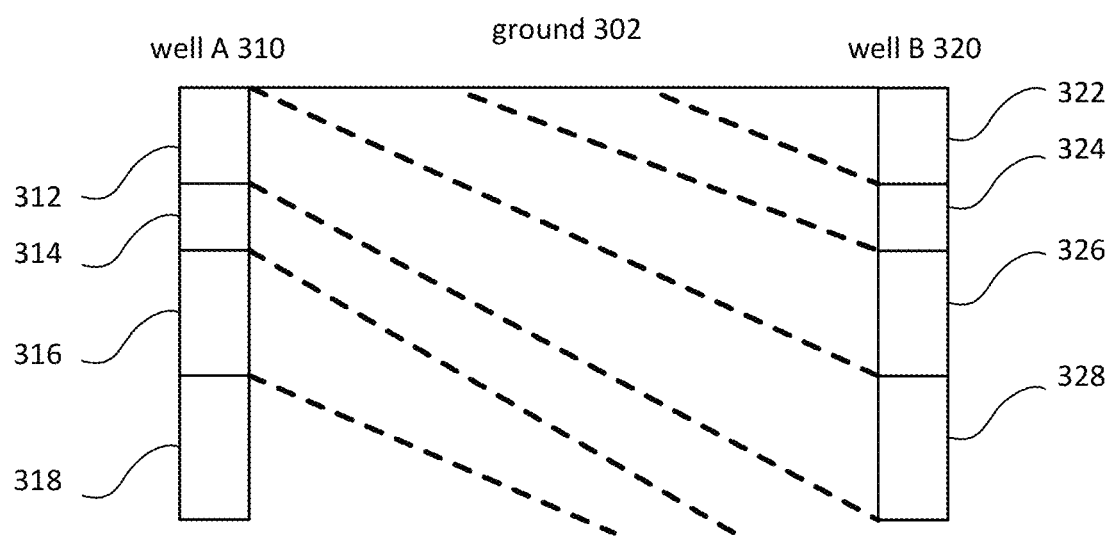

Such representation of spatial distributions of rock properties and/or reservoir internal heterogeneity may not be correct. For example, FIGS. 3C and 3D illustrate alternative spatial distributions of rock properties and/or reservoir internal heterogeneity between the well A 310 and the well B 320. In FIG. 3C, the well A 310 and the well B 320 may be drilled into the ground with similar properties/characteristics (e.g., delta lobes of a delta plain). However, the well A 310 and the well B 320 may be physically separated (e.g., separated by fringing parts of the delta lobes) and the segments 312, 314, 316, 318 of the well A 310 may not be connected to the segments 322, 324, 326, 328 of the well B 320. In FIG. 3D, the well A 310 and the well B 320 may be drilled into the ground with deposited layers being slanted with respect to the ground 302. The segment 312 of the well A 310 may correlate to the segment 328 of the well B 320 (rather than the segment 322). The segments 322, 324, 326 of the well B 310 may not correlate to any segments of the well A 310. The segments 314, 316, 318 of the well A 310 may or may not correlate to segments of the well B 320 below the segment 328.

An important advancement in geological studies is the development of chrono- and sequence stratigraphy. Chrono- and sequence stratigraphy recognizes that sediment rocks are deposited sequentially, one layer after the other over time. Application of chrono- and sequence stratigraphy may enable prediction of rock properties from known locations, such as at locations of wells, to unknown locations such as locations between wells and/or away from wells. In contrast with the lithostratigraphy where the grouping of rocks is based on similar rock properties, chrono- and sequence stratigraphy enables characterization of the rocks by grouping them into generically related packages. Because the rocks within the chrono- and sequence stratigraphy are generically related, within each package, the property distributions and their spatial variations are closely related to the associated depositional processes. These depositional processes are mostly spatially continuous and may be predicted. By identifying and linking the generically related packages, a chrono- and sequence stratigraphic framework may be obtained. The framework may then be used for making predictions of related geologic properties away from the wells, as well as for building reservoir models by filling the properties in the volumes defined by the layers given by the framework.

Referring back to FIG. 1, the electronic storage 13 may be configured to include electronic storage medium that electronically stores information. The electronic storage 13 may store software algorithms, information determined by the processor 11, information received remotely, and/or other information that enables the system 10 to function properly. For example, the electronic storage 13 may store subsurface representation information, information relating to subsurface representation, information relating to simulated subsurface configuration, information relating to simulated subsurface region, information relating to simulated well, well information, information relating wells, information relating to subsurface configuration of wells, information relating to spatial arrangement of wells, information relating to similarity maps, information relating to matched simulated wells, information relating to correlation between wells, and/or other information.

The processor 11 may be configured to provide information processing capabilities in the system 10. As such, the processor 11 may comprise one or more of a digital processor, an analog processor, a digital circuit designed to process information, a central processing unit, a graphics processing unit, a microcontroller, an analog circuit designed to process information, a state machine, and/or other mechanisms for electronically processing information. The processor 11 may be configured to execute one or more machine-readable instructions 100 to facilitate correlating multiple wells. The machine-readable instructions 100 may include one or more computer program components. The machine-readable instructions 100 may include one or more of a subsurface representation component 102, a well component 104, a similarity map component 106, a matched simulated well component 108, a correlation component 110, and/or other computer program components.

The subsurface representation component 102 may be configured to obtain subsurface representation information and/or other information. Obtaining subsurface representation information may include one or more of accessing, acquiring, analyzing, determining, examining, identifying, loading, locating, opening, receiving, retrieving, reviewing, selecting, storing, utilizing, and/or otherwise obtaining the subsurface representation information. The subsurface representation component 102 may obtain subsurface representation information from one or more locations. For example, the subsurface representation component 102 may obtain subsurface representation information from a storage location, such as the electronic storage 13, electronic storage of a device accessible via a network, and/or other locations. The subsurface representation component 102 may obtain subsurface representation information from one or more hardware components (e.g., a computing device, a component of a computing device) and/or one or more software components (e.g., software running on a computing device). Subsurface representation information may be stored within a single file or multiple files.

The subsurface representation information may define one or more subsurface representations. The subsurface representation information may define a subsurface representation by including information that describes, delineates, identifies, is associated with, quantifies, reflects, sets forth, and/or otherwise defines one or more of content, quality, attribute, feature, and/or other aspects of the subsurface representation. For example, the subsurface representation information may define a subsurface representation by including information that makes up the content of the subsurface representation and/or information that is used to identify/determine the content of the subsurface representation. Other types of subsurface representation information are contemplated.

A subsurface representation may refer to a computer-generated representation of a subsurface region, such as a one-dimensional, two-dimensional and/or three-dimensional model of the subsurface region. A subsurface representation may be representative of the depositional environment of wells (e.g., wells to be correlated). A subsurface representation may include geologically plausible arrangement of rock obtained from a modeling process (e.g., stratigraphic forward modeling process). A subsurface representation may provide simulated subsurface configuration at different locations within a simulated subsurface region (e.g., provide simulated well log values at locations in a three-dimensional (x-y-z) coordinate system).

A subsurface region may refer to a part of earth located beneath the surface/located underground. A subsurface region may refer to a part of earth that is not exposed at the surface of the ground. A subsurface region may be defined in a single dimension (e.g., a point, a line) or in multiple dimensions (e.g., a surface, a volume).

A subsurface representation may define simulated subsurface configuration of a simulated subsurface region. Simulated subsurface configuration may refer to subsurface configuration simulated within a subsurface representation. A simulated subsurface region may refer to a subsurface region simulated within a subsurface representation. That is, a subsurface representation may define subsurface configuration of a subsurface region simulated by one or more subsurface models. A subsurface representation may be used as and/or may be referred to as a digital analog. In some implementations, the subsurface representation information may define multiple subsurface representations. Individual ones of the subsurface representations may be used to provide separate set of correlation between the wells. That is, multiple subsurface representations may be used to find multiple scenarios of correlations between wells.

A subsurface model may refer to a computer model (e.g., program, tool, script, function, process, algorithm) that generates subsurface representations. A subsurface model may simulate subsurface configuration within a region underneath the surface (subsurface region). Subsurface configuration may refer to attribute, quality, and/or characteristics of a subsurface region. Subsurface configuration may refer to physical arrangement of materials (e.g., subsurface elements) within a subsurface region. Examples of subsurface configuration simulated by a subsurface model may include types of subsurface materials, characteristics of subsurface materials, compositions of subsurface materials, arrangements/configurations of subsurface materials, physics of subsurface materials, and/or other subsurface configuration. For instance, subsurface configuration may include and/or define types, shapes, and/or properties of materials and/or layers that form subsurface (e.g., geological, petrophysical, geophysical, stratigraphic) structures.

An example of a subsurface model is a computational stratigraphy model. A computational stratigraphy model may refer to a computer model that simulates depositional and/or stratigraphic processes on a grain size scale while honoring physics-based flow dynamics. A computational stratigraphy model may simulate rock properties, such as velocity and density, based on rock-physics equations and assumptions. Input to a computational stratigraphy model may include information relating to a subsurface region to be simulated. For example, input to a computational stratigraphy model may include paleo basin floor topography, paleo flow and sediment inputs to the basin, and/or other information relating to the basin. In some implementations, input to a computational stratigraphy model may include one or more paleo geologic controls, such as climate changes, sea level changes, tectonics and other allocyclic controls. Output of a computational stratigraphy model may include one or more subsurface representations. A subsurface representation generated by a computational stratigraphy model may be referred to as a computational stratigraphy model representation.

A computational stratigraphy model may include a forward stratigraphic model. A forward stratigraphic model may be an event-based model, a process mimicking model, a reduced physics based model, and/or a fully physics based model (e.g., fully based on physics of flow and sediment transport). A forward stratigraphic model may simulate one or more sedimentary processes that recreate the way stratigraphic successions develop and/or are preserved. The forward stratigraphic model may be used to numerically reproduce the physical processes that eroded, transported, deposited and/or modified the sediments over variable time periods. In a forward modelling approach, data may not be used as the anchor points for facies interpolation or extrapolation. Rather, data may be used to test and validate the results of the simulation. Stratigraphic forward modelling may be an iterative approach, where input parameters have to be modified until the results are validated by actual data. Usage of other subsurface models and other subsurface representations are contemplated.

Figure 4:
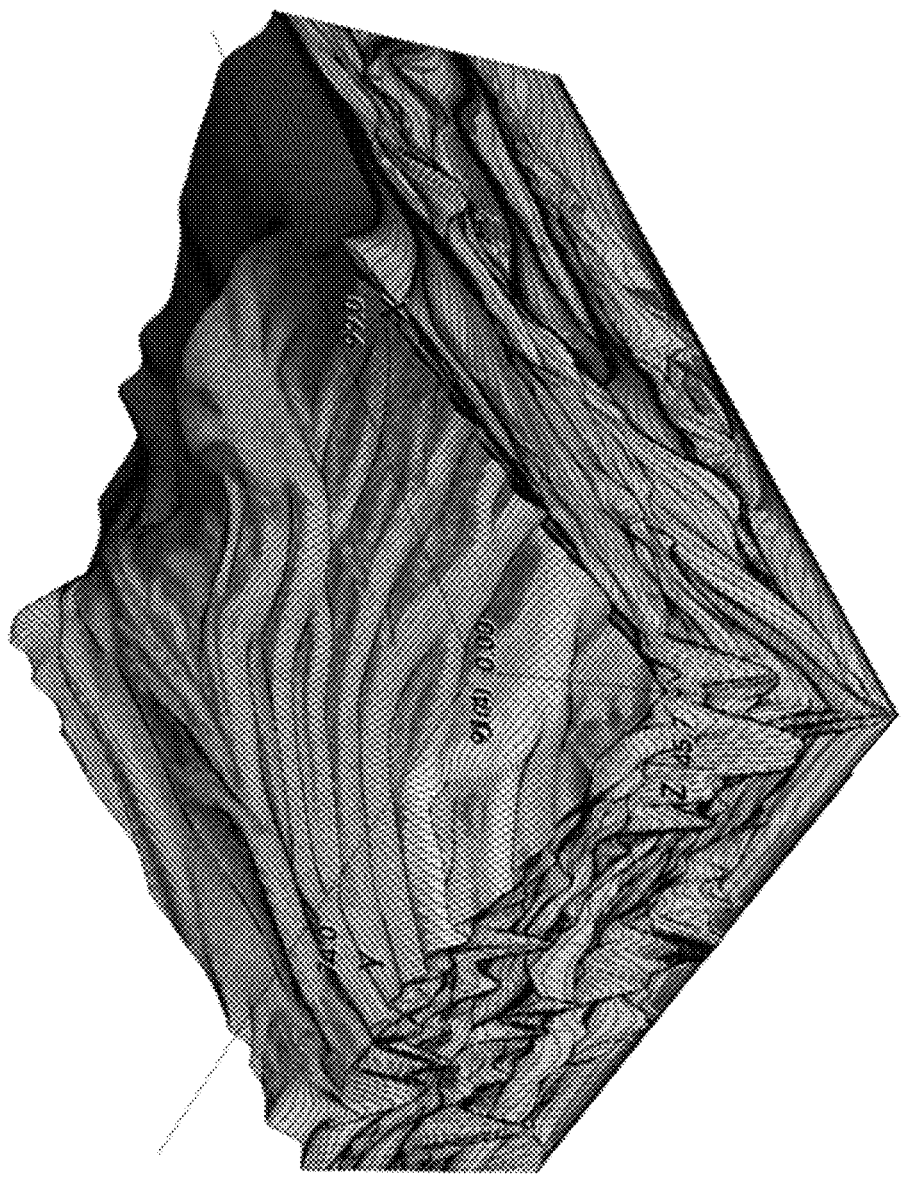
FIG. 4 illustrates an example subsurface representation.

FIG. 4 illustrates an example subsurface representation 400. The subsurface representation 400 may define simulated subsurface configuration of a simulated subsurface region. The simulated subsurface configuration may be defined within the subsurface representation 400 as a function of spatial location, such as a function of vertical spatial location (e.g., depth), lateral spatial location (e.g., x-y coordinate in map view), and/or other spatial location. For example, the subsurface representation 400 may define different types, shapes, and/or properties of materials and/or layers as a function of depth into the ground and as a function of lateral spatial location. The simulated subsurface configuration defined within the subsurface representation 400 may simulate the subsurface configuration that would be seen within a volume (e.g., well, reservoir) in the ground.

A subsurface representation may be representative of a subsurface region of interest. For example, the simulated subsurface configuration defined by a subsurface representation may be representative of the subsurface configuration of a reservoir of interest. Other subsurface regions of interest are contemplated. In some implementations, a subsurface representation may be scaled in area size and thickness to match a subsurface region of interest. For example, lateral size and/or vertical depth of a subsurface representation may be changed to be comparable to the size and thickness of a subsurface region of interest.

A simulated subsurface region of a subsurface representation may include simulated wells. For example, the simulated subsurface region of the subsurface representation 400 may include a first simulated well, a second simulated well, and/or other simulated wells. A simulated well may refer to a simulated volume, a simulated hole, and/or a simulated tunnel within the simulated subsurface region. A simulated well may refer to a portion of the subsurface representation/simulated subsurface region that includes, runs through, and/or exposes different types of simulated layers. A simulated well may be characterized by the simulated layers that are included within and/or surround the simulated well. A simulated well may extend along one or more directions. For example, a simulated well may include a simulated vertical well, a simulated horizontal well, a simulated deviated well, and/or other type of simulated well.

Simulated subsurface configuration of a simulated subsurface region may define simulated correlation between simulated wells within the simulated subsurface region. Simulated correlation between simulated wells may refer to correlation simulated between simulated wells within a subsurface representation. The subsurface configuration between wells in a subsurface region simulated within a subsurface representation may define the correlation between the wells.

For example, the simulated subsurface configuration of the simulated subsurface region may describe, identify, quantify, reflect, and/or set forth how different simulated wells within the simulated subsurface region are correlated. For example, the subsurface representation 400 (shown in FIG. 4) may include multiple simulate wells in different locations within the simulated subsurface region. The simulated subsurface configuration of the subsurface representation 400 may define how the different wells are correlated based on the locations of the wells within the subsurface representation 400 and the connectivity of rocks between the different locations. For instance, the subsurface representation 400 may include a first simulated well and a second simulated, and the simulated subsurface configuration between the two simulated wells may define simulated correlation between the first simulated well and the second simulated well.

In some implementations, a subsurface representation may include a computational stratigraphy model representation, and the correlation between the wells may include chrono-sequence stratigraphic correlation. The correlation of wells within the computational stratigraphy model representation may include packages of rocks linked together in a geologic way. Because the computational stratigraphy model representation is built sequentially, layer by layer, the chrono- and sequence stratigraphic correlations between any simulated wells in the subsurface representation may be given by the layers of the subsurface representation. The layers of the subsurface representation between the simulated wells may determine the connectivity and/or other linkage characteristics of the simulated wells.

The well component 104 may be configured to obtain well information and/or other information. Obtaining well information may include one or more of accessing, acquiring, analyzing, determining, examining, identifying, loading, locating, opening, receiving, retrieving, reviewing, selecting, storing, utilizing, and/or otherwise obtaining the well information. The well component 104 may obtain well information from one or more locations. For example, the well component 104 may obtain well information from a storage location, such as the electronic storage 13, electronic storage of a device accessible via a network, and/or other locations. The well component 104 may obtain well information from one or more hardware components (e.g., a computing device, a component of a computing device) and/or one or more software components (e.g., software running on a computing device). Well information may be stored within a single file or multiple files.

The well information may define subsurface configuration of wells and spatial arrangement of the wells. For example, the well information may define subsurface configuration of wells and spatial arrangement of a first well, a second well, and/or other wells. The subsurface configuration of a well may be defined as a function of spatial location (e.g., vertical spatial location, lateral spatial location). Subsurface configuration of a well may refer to attribute, quality, and/or characteristics of the well. Subsurface configuration of a well may refer to physical arrangement of materials (e.g., subsurface elements) within the well. Spatial arrangement of wells may refer to how the wells are physically arranged with respect to one another. Spatial arrangement of wells may include relative positions of the wells. The relative positions of the wells may include relative lateral positions (e.g., lateral direction and distance between wells), relative vertical positions (e.g., vertical direction and distance between wells), relative orientation of wells, and/or other relative positions.

The well information may define subsurface configuration of wells and spatial arrangement of the wells by including information that describes, delineates, identifies, is associated with, quantifies, reflects, sets forth, and/or otherwise defines one or more of content, quality, attribute, feature, and/or other aspects of the surface configuration of the wells and spatial arrangement of the wells. For example, the well information may define subsurface configuration of wells by including information that makes up the content of the wells and/or information that is used to identify/determine the content of the wells. For instance, the well information may include one or more well logs, information determined/extracted from one or more well logs, information determined/extracted from one or more well cores, and/or other information. For example, the well information may provide information on one or more properties of the wells, such as rock types, layers, grain sizes, porosity, and/or permeability. The well information may define spatial arrangement of wells by including information that sets forth the relative positions of the wells and/or information that is used to identify/determine the relative positions of the wells.

Figure 5B:
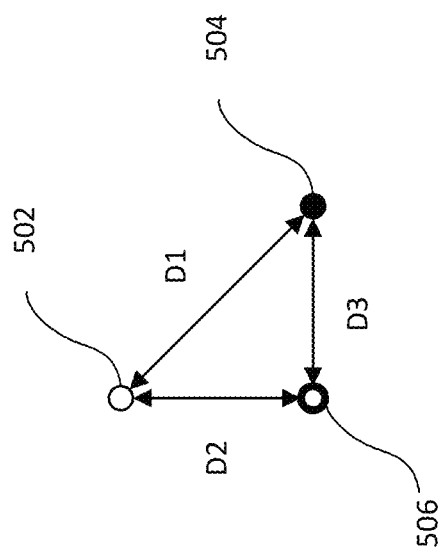
FIGS. 5A and 5B illustrate example spatial arrangements of wells.
Figure 5A:
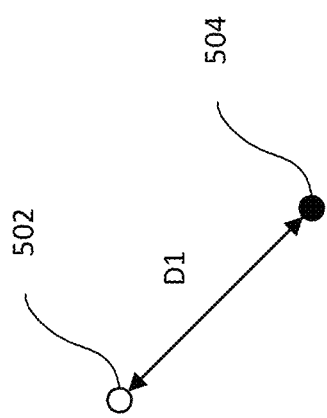

FIGS. 5A and 5B illustrate example spatial arrangements of wells. In FIG. 5A, well 502 and a well 504 may be separated by a distance D1. In FIG. 5B, the well 502 and the well 504 may be separated by a distance D1, the well 502 and a well 506 may be separated by a distance D2, and the well 504 and the well 506 may be separated by a distance D3. While the spatial arrangements of wells shown in FIGS. 5A and 5B show lateral distances between the wells, this is merely as examples and are not meant to be limiting. Relative positions of wells may include difference in lateral locations, difference in vertical locations, and/or difference in other locations of the wells.

The similarity map component 106 may be configured to generate similarity maps for the wells. The similarity map component 106 may be configured to generate one or more similarity maps for individual ones of the wells. For example, the similarity maps may include a first similarity map for the first well, a second similarity map for the second well, and/or other similarity maps for other wells. A similarity map may characterize extent of similarity between the corresponding well and different locations within the simulated subsurface region. For example, a similarity map may show the quantity and/or quality of matching between the wells and the simulated wells within the simulated surface region. The extent of similarity between the corresponding well and different locations within the simulated subsurface region may be given by one or more similarity measures/scores of the similarity map. The similarity measures/scores may enable comparison of well-similarity between different locations within the simulated subsurface region. For example, the similarity measures/scores may enable comparison of whether one simulated well positioned at one location within the simulated subsurface region is a better or worse match to a well than another simulated well positioned at another location within the simulated subsurface region.

The similarity maps may be generated based on comparison of the subsurface configuration of the wells with the simulated subsurface configuration of the simulated subsurface region, and/or other information. For example, lithological comparison may be performed between the subsurface configuration of the wells with the simulated subsurface configuration of the simulated subsurface region to determine to what extent the simulated subsurface configuration a simulated well matches the subsurface configuration of a well.

In some implementations, the simulated subsurface configuration of the simulated subsurface region may be transformed so that the transformed simulated subsurface configuration is comparable to the subsurface configuration of the wells, or vice versa. For example, if the digital analog contains simulated grain size logs for different locations within the simulated subsurface region and the well information includes neutron density logs of wells, the simulated grain size logs of the digital analog may be transformed into neutron density logs by applying one or more transformation functions, thereby making the simulated subsurface configuration of the simulated wells comparable to the subsurface configuration of the wells.

The extent of similarity between a well and a simulated well may be determined for the entire length of the well and/or for different segments of the well. For example, segments/packages of well along the length of the well may be compared to simulated segments/packages of simulated well along the length of the simulated well to determine similarity between the segments/packages of well and the simulated segments/packages of simulated well. The similarity between the segments/packages may be combined (e.g., averaged, weighted) to provide a similarity measure/score for the simulated well at a particular lateral location. The similarity measures/scores may be generated for different lateral (x-y) location within the simulated surface region to generate a two-dimensional similarity map. As another example, multiple similarity measures/scores may be provided for a simulated well at a particular lateral location, with the different similarity measures/scores reflecting the extent of similarity for different vertical portions (e.g., different vertical segment/package, different length of well) of the well. The similarity measures/scores may be generated for different lateral and vertical locations within the simulated surface region to generate a three-dimensional similarity map.

For example, for a location within the simulated region/subsurface representation, the simulated subsurface configuration of a simulated well, such as contained in a simulated well log, may be obtained. The subsurface configuration of a well, such as contained in a well log, may be compared to the simulated subsurface configuration of the simulated well using one or more pattern recognition techniques, pattern matching techniques, lithostratigraphic analysis techniques, and/or other comparison techniques. The comparison may result in mapping of a vertical portion in the well log to a corresponding vertical portion in the simulated well log, and a similarity measure/score that indicates the quality of matching between the two vertical portions (e.g., high score for high matching and low score for low matching, or vice versa).

In some implementations, user may select one or more parameters used to perform comparison between subsurface configuration of a well and simulated subsurface configuration of a simulated well. For example, user may select which comparison techniques may be used to perform the comparison, which characteristics of the subsurface configuration are factored in the comparison, the number of segments into which a well is divided for comparison, how the subsurface configuration are sampled for comparison, how different characteristics of the subsurface configuration are weighed in the comparison (e.g., equal or different weighing of different characteristics), and/or the lateral and/or vertical size of the wells compared at a time, the length of the wells compared for a lateral location. Other user controls are contemplated.

In some implementations, vertical offsets in spatial locations may be taken into account for generation of similarity measure/score and/or similarity maps. For example, a well log may be compared to more than one simulated well log sub-sequence from the digital analog at a given lateral (x-y) location. The geometry of a sub-sequence may be defined by a top point (x, y, z-top) and/or a bottom point (x, y, z-bottom) within the digital analog. One or both of the top point and the bottom point may be varied to provide similarity measure/score for different vertical locations/portions within the simulated subsurface region/subsurface representation. As another example, the top point or the bottom point and the thickness of the sub-sequence may be varied to provide similarity measure/score for different vertical locations/portions within the simulated subsurface region/subsurface representation.

The comparison of wells to different locations within a simulated subsurface region/subsurface representation may begin at the top of the simulated subsurface region/subsurface representation, at the bottom of the simulated subsurface region/subsurface representation, and/or somewhere in the middle of the simulated subsurface region/subsurface representation. That is, a simulated well may extend from the top of the simulated subsurface region/subsurface representation, extend from the bottom of the simulated subsurface region/subsurface representation, or contained within middle of the simulated subsurface region/subsurface representation.

In some implementations, different similarity measure/score and/or different similarity maps may be generated for different intervals of wells. For example, rather than having a single similarity measure/score or a single similarity map to provide comparison for entire length of a well and different locations within the simulated subsurface region/subsurface representation, separate similarity measures/scores and/or a separate similarity maps may be generated for different vertical intervals (slices) of the well and the simulated subsurface region/subsurface representation. In some implementations, the sizes of wells/well portions and simulated wells/simulated well portions that are compared may be different. For example, subsurface configuration of a 10-meter portion of a well may be compared to simulated subsurface configuration of an 8-meter portion and/or a 12-meter portion of a simulated well. Other generation of similarity measure/score and/or similarity maps are contemplated.

In some implementations, a similarity map may be generated and/or stored as a heat map. The extent of similarity may be given within the heat map based on one or more visual characteristics (e.g., intensity, color) of the pixels within the heat map. In some implementations, a similarity map may be generated and/or stored as a matrix. The matrix may include cells for different positions within the simulated subsurface region, and the similarity measures/scores for the corresponding positions may be stored as one or more values within the cells.

FIG. 6 illustrates example similarity maps 602, 604, 606. Individual ones of the similarity maps 602, 604, 606 may characterize extent of similarity between the corresponding wells and different locations within the simulated subsurface region/subsurface representation. For example, the similarity map 602 may characterize extent of similarity between the well 502 and different locations within the simulated subsurface region/subsurface representation, the similarity map 604 may characterize extent of similarity between the well 504 and different locations within the simulated subsurface region/subsurface representation, and the similarity map 606 may characterize extent of similarity between the well 506 and different locations within the simulated subsurface region/subsurface representation The matched simulated well component 108 may be configured to identify one or more groupings of matched simulated wells within the simulated subsurface region/subsurface representation. A matched simulated well within the simulated subsurface region/subsurface representation may refer to a simulated well that has been matched/mapped to a well. Matched simulated wells may be identified within the simulated subsurface region/subsurface representation to determine correlation between the corresponding wells. A grouping of matched simulated well may refer to a set of matched simulated wells within the simulated subsurface region/subsurface representation. Individual groupings of matched simulated wells may include a matched simulated well for individual ones of the wells. For example, for a triplet of wells, a grouping of matched simulated wells may include a first simulated well matched to a first well, a second simulated well matched to a second well, and a third simulated well matched to a third well.

The grouping(s) of matched simulated wells may be identified based on the similarity maps, the spatial arrangement of the wells, and/or other information. For example, for a pair of well, the grouping(s) of matched simulated wells may be identified based on the extent of similarity between the wells and different locations within the simulated subsurface region/subsurface representation and the distance between the wells. For multiple wells, the grouping(s) of matched simulated wells may be identified based on the extent of similarity between the wells and different locations within the simulated subsurface region/subsurface representation and the relative positions of the wells. The matched simulated wells may be identified to include similar subsurface configuration as the wells while honoring the spatial arrangement of the wells.

For example, for two wells A and B, two corresponding similarity maps may be used to identify one or more pairs of simulated wells A' and B' as matched simulated wells. The similarity map for well A may be used to identify the simulated well A' with simulated subsurface configuration that matches the subsurface configuration of well A. The similarity map for well B may be used to identify the simulated well B' with simulated subsurface configuration that matches the subsurface configuration of well B. The distance between the wells A and B may be used to restrict the identification of simulated well A' and B' so that the simulated wells A' and B' are separated by the same distance. In some implementations, distance tolerance may allow for variation between the amount of separation of the simulated wells A' and B' and the amount of separate of the wells A and B. For example, for distance D between the wells A and B, the distance between the simulated wells A' and B' may range between D−Dε and D+Dε, where c is the allowed tolerance of distance error.

In some implementations, the matched simulated wells may be identified in a sequence. For example, with respect to wells A and B, a simulated well A' may first be identified as the matched simulated well for well A. Then, using the location of the simulated well A', potential locations for the simulated well B' within the similarity map for well B may be searched to find the simulated well B' as the matched simulated well for well B. For example, a band of area around the location of the simulated well A' may be searched to identify the simulated well B'. The band may be located at distance D from the location of the simulated well A' and may have a thickness of 2×Dε to allow for tolerance in distance error.

In some implementations, the matched simulated wells may be identified simultaneously. For example, with respect to wells A and B, a simulated well A' and a simulated well B' may be identified together as matched simulated wells for wells A and B using the similarity map for well A, the similarity map for well B, and the distance between the wells A and B. Thus, the spatial relationship between the wells may be honored in identifying the matched simulated wells.

In some implementations, identification of the grouping(s) of matched simulated wells within the simulated subsurface region/subsurface representation based on the similarity maps and the spatial arrangement of the wells may include determination of portions (e.g., two-dimensional area, three-dimensional volume) of the similarity maps within which the matched simulated wells are identified. That is, before the matched simulated wells are identified, the similarity maps may be analyzed to determine in which portions of the similarity maps the extent of similarity is good (high) enough to locate the matched simulated wells.

The portions of the similarity maps within which the matched simulated wells are identified may be determined based on thresholding of the extent of similarity between the individual ones of the wells and the different locations within the simulated subsurface region/subsurface representation, and/or other information. For a similarity map, the similarity measure/score for different locations within the similarity map may be compared with one or more threshold values to determine whether the locations are suitable/ acceptable or unsuitable/unacceptable for identification of a matched simulated well. Same or different threshold values may be used for different wells and/or different similarity maps.

For example, referring to FIG. 6, a portion 612 within the similarity map 602 may be determined based on thresholding of the extent of similarity between the well 502 and different locations within the simulated subsurface regions/ subsurface representation. The portion 612 may include the locations within which a matched simulated well for the well 502 may be identified (suitable/acceptable location for matched simulated well corresponding to the well 502). A portion 614 within the similarity map 604 may be determined based on thresholding of the extent of similarity between the well 504 and different locations within the simulated subsurface regions/subsurface representation. The portion 614 may include the locations within which a matched simulated well for the well 504 may be identified (suitable/acceptable location for matched simulated well corresponding to the well 504). A portion 616 within the similarity map 606 may be determined based on thresholding of the extent of similarity between the well 506 and different locations within the simulated subsurface regions/ subsurface representation. The portion 616 may include the locations within which a matched simulated well for the well 506 may be identified (suitable/acceptable location for matched simulated well corresponding to the well 506).

A combined similarity map 650 may include the similarity maps 602, 604, 606 stacked on top of each other. The combined similarity map 650 may show the relative positions of the portions 612, 614, 616 within the corresponding similarity maps 602, 604, 606.

FIGS. 7A and 7B illustrate example groupings of matched simulated wells. In FIG. 7A, the grouping of matched simulated wells may include a simulated well 702 matched to the well 502, a simulated well 704 matched to the well 504, and a simulated well 706 matched to the well 506. The simulated well 702 may be located within the portion 612 of the similarity map 602, the simulated well 704 may be located within the portion 614 of the similarity map 604, and the simulated well 706 may be located within the portion 616 of the similarity map 606.

The grouping of matched simulated wells may be identified to honor the spatial arrangement of the wells 502, 504, 506. For example, the simulated well 702 and the simulated well 704 may be separated by a distance D1 (or within distance tolerance of D1), the simulated well 702 and the simulated well 706 may be separated by a distance D2 (or within distance tolerance of D2), and the simulated well 704 and the simulated well 706 may be separated by a distance D3 (or within distance tolerance of D3).

In FIG. 7B, the grouping of matched simulated wells may include a simulated well 712 matched to the well 502, a simulated well 714 matched to the well 504, and a simulated well 716 matched to the well 506. The simulated well 712 may be located within the portion 612 of the similarity map 602, the simulated well 714 may be located within the portion 614 of the similarity map 604, and the simulated well 716 may be located within the portion 616 of the similarity map 606.

The grouping of matched simulated wells may be identified to honor the spatial arrangement of the wells 502, 504, 506. For example, the simulated well 712 and the simulated well 714 may be separated by a distance D1 (or within distance tolerance of D1), the simulated well 712 and the simulated well 716 may be separated by a distance D2 (or within distance tolerance of D2), and the simulated well 714 and the simulated well 716 may be separated by a distance D3 (or within distance tolerance of D3).

The simulated distances between the simulated wells 702, 704, 706 may match the distances between the wells 502, 504, 506. The simulated distances between the simulated wells 712, 714, 716 may match the distances between the wells 502, 504, 506. In some implementations, a simulated distance may match the corresponding distance based on the simulated distance being within one or more tolerance distances of the corresponding distance.

The simulated relative positions of the simulated wells 702, 704, 706 may match the relative positions of the wells 502, 504, 506. The simulated relative positions of the simulated wells 712, 714, 716 may match the relative positions of the wells 502, 504, 506. In some implementations, simulated relative positions may match the corresponding relative positions based on the simulated relative positions being within one or more tolerance distances of the corresponding relative positions.

In some implementations, multiple groupings of matched simulated wells may be identified within a simulated subsurface region/subsurface representation. For example, two separate groupings of matched simulated wells may be identified within a simulated subsurface region/subsurface representation as shown in FIGS. 7A and 7B. The different groupings of matched simulated wells may include one or more of the simulated wells being located at different locations within the simulated subsurface region/subsurface representation. Individual grouping of matched simulated wells may provide a scenario of correlation between the wells. Thus, multiple scenarios of correlations between wells may be determined from a single simulated subsurface region/subsurface representation by identifying multiple groupings of matched simulated wells.

In some implementations, matching quality of individual grouping of matched simulated wells may be determined. The matching quality of individual grouping of matched simulated wells may be determined based on extent of matching of the matched simulated wells with corresponding wells, extent of matching of simulated spatial arrangement of the matched simulated wells with the spatial arrangement of the wells, and/or other information. For example, the match quality of a grouping of matched simulated wells to wells may be determined based on the extent to which the simulated subsurface configuration of the matched simulated wells matches the subsurface configuration of the wells. The match quality of a grouping of matched simulated wells to wells may be determined based on the extent to which the simulated spatial arrangement of the matched simulated wells matches the spatial arrangement of the wells. The matching quality of individual grouping of matched simulated wells may be used to quantify the likelihood of the well correlation provided by the individual grouping of matched simulated wells. That is, the matching quality of a grouping of matched simulated well may indicate the likelihood that the well correlation provided (e.g., predicted, estimated) by the grouping of matched simulated well may match actual and/or realistic correlation between the wells in the real world.

The correlation component 110 may be configured to determine correlation between the wells based on the simulated correlation between the matched simulated wells and/or other information. The simulated subsurface configuration between the matched simulated wells in the simulated subsurface region/subsurface representation may define simulated correlation between the matched simulated wells, and these simulated correlation may be used as and/or used to determine the correlation between the corresponding wells. That is, the simulated subsurface region/subsurface representation including simulated wells may define simulated correlation between the simulated wells, and the simulated correlation between the simulated wells in the simulated subsurface region/subsurface representation may be used to determine correlation between wells in the real world.

In some implementations, a subsurface representation may include a computational stratigraphy model representation, and the correlation between the wells may include chrono-sequence stratigraphic correlation. That is, the computational stratigraphy model representation may provide simulated chrono-sequence stratigraphic correlation between simulated wells within the representation, and the matching of the real wells to the simulated wells may be used to provide the simulated chrono-sequence stratigraphic correlation between simulated wells as the chrono-sequence stratigraphic correlation between the wells in the real world.

For example, a simulated well A' in a simulated subsurface region/subsurface representation may be matched to a well A, and a simulated well B' in a simulated subsurface region/subsurface representation may be matched to a well B (based on similarity maps for wells A and B and spatial arrangement of the wells A and B). The simulated subsurface configuration between the simulated well A' and the simulated well B' in the simulated subsurface region/subsurface representation may define simulated correlation between the simulated well A' and the simulated well B'. The correlation between the well A and the well B may be determined based on the simulated correlation between the simulated well A' and the simulated well B', and/or other information. The correlation between the well A and the well B (between segments of wells A and B) may be equivalent to the simulated correlation between the simulated well A' and the simulated well B' (between segments of simulated wells A' and B'), as defined within the simulated subsurface region/subsurface representation.

Thus, a direct and automated chronostratigraphic correlation between wells may be determined using subsurface representations. Because a subsurface representation (e.g., from a forward model, computational stratigraphy model) contains the chrono- and sequence stratigraphic correlations between pairs of any simulated wells, matching (mapping) of real wells to simulated wells enables simulated correlations between the simulated wells to be used as and/or to determine correlations of real wells.

By matching a real well to a simulated well, every layer of the deposit in the real well is mapped to a layer in the simulated well, and the connectivity of the layers between the real well is determined using the simulated connectivity of the layers between the simulated wells. Using simulated correlation between simulated wells in the subsurface representation as correlation between real wells may results in multiple well correlation to be automatically tied. Lithostratigraphic correlation of wells, on the other hand, may result in mismatch in correlation. For example, referring to FIG. 5B, lithostratigraphy correlation may be used to determine correlation between the well 502 and the well 504 and determine correlation between the well 504 and the well 506. Such correlation determined between the wells 502, 504, 506 may result in mismatch in correlation (devil's stairs) between the well 502 and the well 506. The direct and automated chronostratigraphic correlation between wells as described herein may result in correlation between multiple wells that are automatically tied. For example, referring to FIG. 7A, the grouping of matched simulated wells 702, 704, 706 may result in correlation between the corresponding wells 502, 504, 506 that are automatically tied.

In some implementations, multiple scenarios of correlation between the wells may be provided based on identification of multiple groupings of matched simulated well within the stimulated surface region and/or other information. Individual grouping of matched simulated wells may provide a scenario of correlation between the wells. For example, the grouping of matched simulated wells 702, 704, 706 in FIG. 7A may provide a scenario of correlation between the wells 502, 504, 506 and the grouping of matched simulated wells 712, 714, 716 in FIG. 7B may provide another scenario of correlation between the wells 502, 504, 506. Thus, multiple scenarios of correlation between the wells may be provided using a single subsurface representation.

In some implementations, separate sets of correlation between the wells may be provided based on the subsurface representation information defining multiple subsurface representations and/or other information. A set of correlation between the wells may include one or more correlation between the wells. Individual ones of the subsurface representations may be used to provide separate set of correlation between the wells. That is, separate subsurface representations may be used to provide separate sets of correlation between the wells. Different subsurface representations may provide simulation of different subsurface regions, different simulated subsurface configuration, and/or different simulated correlation between simulated wells.

In some implementations, the matching qualities of different subsurface representations may be determined based on extent of matching of the matched simulated wells with corresponding wells, extent of matching of simulated spatial arrangement of the matched simulated wells with the spatial arrangement of the wells, and/or other information. The matching quality of individual subsurface representation may be used to quantify the likelihood of the well correlation provided by the individual subsurface representation. That is, the matching quality of a subsurface representation may indicate the likelihood that the well correlation provided (e.g., predicted, estimated) by the subsurface representation may match actual and/or realistic correlation between the wells in the real world.

Implementations of the disclosure may be made in hardware, firmware, software, or any suitable combination thereof. Aspects of the disclosure may be implemented as instructions stored on a machine-readable medium, which may be read and executed by one or more processors. A machine-readable medium may include any mechanism for storing or transmitting information in a form readable by a machine (e.g., a computing device). For example, a tangible computer-readable storage medium may include read-only memory, random access memory, magnetic disk storage media, optical storage media, flash memory devices, and others, and a machine-readable transmission media may include forms of propagated signals, such as carrier waves, infrared signals, digital signals, and others. Firmware, software, routines, or instructions may be described herein in terms of specific exemplary aspects and implementations of the disclosure, and performing certain actions.

In some implementations, some or all of the functionalities attributed herein to the system 10 may be provided by external resources not included in the system 10. External resources may include hosts/sources of information, computing, and/or processing and/or other providers of information, computing, and/or processing outside of the system 10.

Although the processor 11 and the electronic storage 13 are shown to be connected to the interface 12 in FIG. 1, any communication medium may be used to facilitate interaction between any components of the system 10. One or more components of the system 10 may communicate with each other through hard-wired communication, wireless communication, or both. For example, one or more components of the system 10 may communicate with each other through a network. For example, the processor 11 may wirelessly communicate with the electronic storage 13. By way of non-limiting example, wireless communication may include one or more of radio communication, Bluetooth communication, Wi-Fi communication, cellular communication, infrared communication, or other wireless communication. Other types of communications are contemplated by the present disclosure.

Although the processor 11 is shown in FIG. 1 as a single entity, this is for illustrative purposes only. In some implementations, the processor 11 may comprise a plurality of processing units. These processing units may be physically located within the same device, or the processor 11 may represent processing functionality of a plurality of devices operating in coordination. The processor 11 may be separate from and/or be part of one or more components of the system 10. The processor 11 may be configured to execute one or more components by software; hardware; firmware; some combination of software, hardware, and/or firmware; and/or other mechanisms for configuring processing capabilities on the processor 11.

It should be appreciated that although computer program components are illustrated in FIG. 1 as being co-located within a single processing unit, one or more of computer program components may be located remotely from the other computer program components. While computer program components are described as performing or being configured to perform operations, computer program components may comprise instructions which may program processor 11 and/or system 10 to perform the operation.

While computer program components are described herein as being implemented via processor 11 through machine-readable instructions 100, this is merely for ease of reference and is not meant to be limiting. In some implementations, one or more functions of computer program components described herein may be implemented via hardware (e.g., dedicated chip, field-programmable gate array) rather than software. One or more functions of computer program components described herein may be software-implemented, hardware-implemented, or software and hardware-implemented The description of the functionality provided by the different computer program components described herein is for illustrative purposes, and is not intended to be limiting, as any of computer program components may provide more or less functionality than is described. For example, one or more of computer program components may be eliminated, and some or all of its functionality may be provided by other computer program components. As another example, processor 11 may be configured to execute one or more additional computer program components that may perform some or all of the functionality attributed to one or more of computer program components described herein.

The electronic storage media of the electronic storage 13 may be provided integrally (i.e., substantially non-removable) with one or more components of the system 10 and/or as removable storage that is connectable to one or more components of the system 10 via, for example, a port (e.g., a USB port, a Firewire port, etc.) or a drive (e.g., a disk drive, etc.). The electronic storage 13 may include one or more of optically readable storage media (e.g., optical disks, etc.), magnetically readable storage media (e.g., magnetic tape, magnetic hard drive, floppy drive, etc.), electrical charge-based storage media (e.g., EPROM, EEPROM, RAM, etc.), solid-state storage media (e.g., flash drive, etc.), and/or other electronically readable storage media. The electronic storage 13 may be a separate component within the system 10, or the electronic storage 13 may be provided integrally with one or more other components of the system 10 (e.g., the processor 11). Although the electronic storage 13 is shown in FIG. 1 as a single entity, this is for illustrative purposes only. In some implementations, the electronic storage 13 may comprise a plurality of storage units. These storage units may be physically located within the same device, or the electronic storage 13 may represent storage functionality of a plurality of devices operating in coordination.

Figure 2:
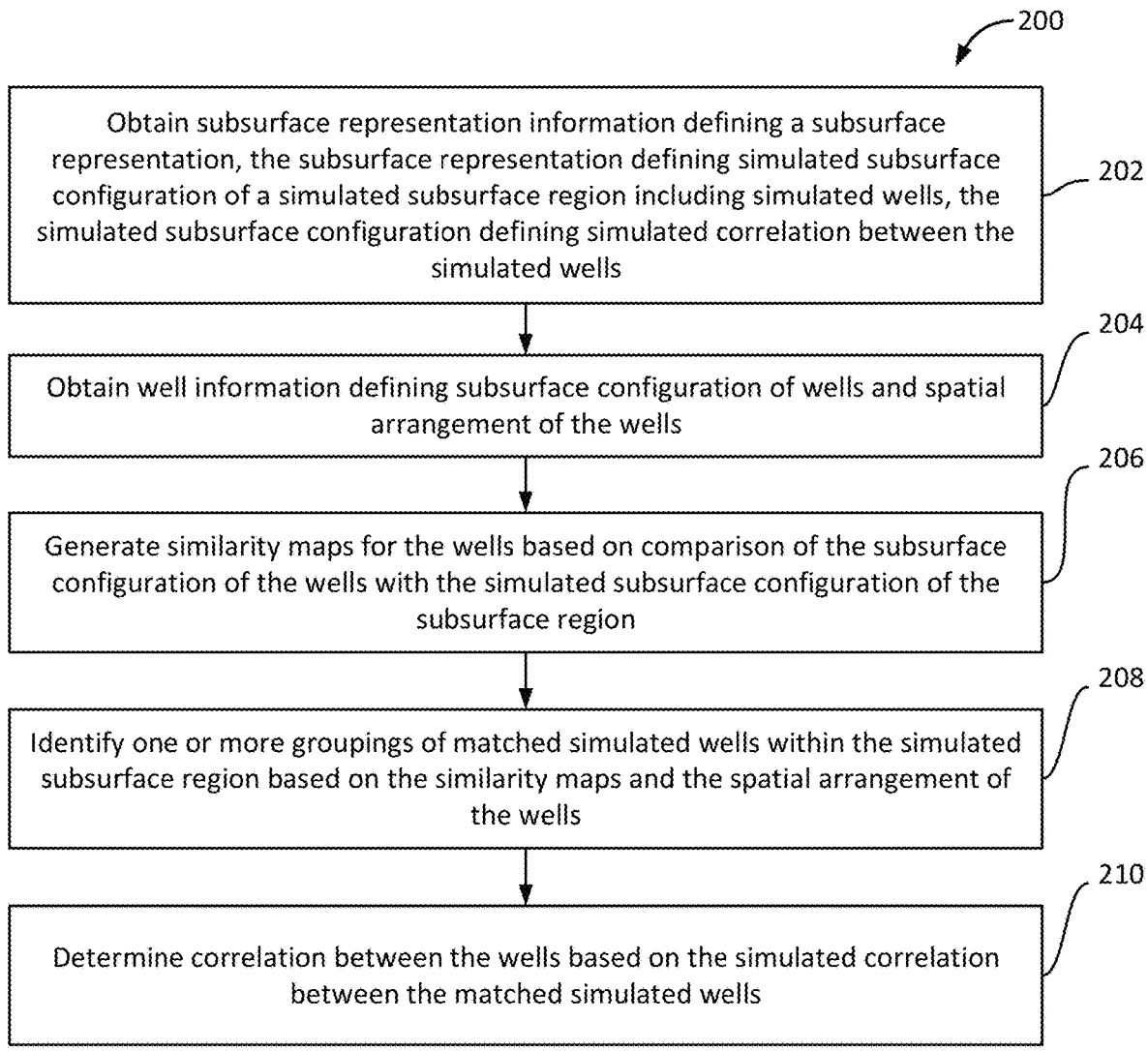
FIG. 2 illustrates an example method for correlating multiple wells.

FIG. 2 illustrates method 200 for correlating multiple wells. The operations of method 200 presented below are intended to be illustrative. In some implementations, method 200 may be accomplished with one or more additional operations not described, and/or without one or more of the operations discussed. In some implementations, two or more of the operations may occur substantially simultaneously.

In some implementations, method 200 may be implemented in one or more processing devices (e.g., a digital processor, an analog processor, a digital circuit designed to process information, a central processing unit, a graphics processing unit, a microcontroller, an analog circuit designed to process information, a state machine, and/or other mechanisms for electronically processing information). The one or more processing devices may include one or more devices executing some or all of the operations of method 200 in response to instructions stored electronically on one or more electronic storage media. The one or more processing devices may include one or more devices configured through hardware, firmware, and/or software to be specifically designed for execution of one or more of the operations of method 200.

Referring to FIG. 2 and method 200, at operation 202, subsurface representation information may be obtained. The subsurface representation information may define one or more subsurface representations. A subsurface representation may define simulated subsurface configuration of a simulated subsurface region including simulated wells. The simulated wells may include a first simulated well, a second simulated well, and/or other simulated wells. The simulated subsurface configuration of the simulated subsurface region may define simulated correlation between the simulated wells such that the simulated subsurface configuration of the simulated subsurface region defines simulated correlation between the first simulated well and the second simulated well. In some implementation, operation 202 may be performed by a processor component the same as or similar to the subsurface representation component 102 (Shown in FIG. 1 and described herein).

At operation 204, well information may be obtained. The well information may define subsurface configuration of wells and spatial arrangement of the wells. The wells may include a first well, a second well, and/or other wells. The spatial arrangement of the first well and the second well may include the first well separated from the second well by a distance. In some implementation, operation 204 may be performed by a processor component the same as or similar to the well component 104 (Shown in FIG. 1 and described herein).

At operation 206, similarity maps for the wells may be generated based on comparison of the subsurface configuration of the wells with the simulated subsurface configuration of the simulated subsurface region, and/or other information. Individual similarity maps may characterize extent of similarity between individual ones of the wells and different locations within the simulated subsurface region. The similarity maps may include a first similarity map for the first well, a second similarity map for the second well, and/or other similarity maps for other wells. In some implementation, operation 206 may be performed by a processor component the same as or similar to the similarity map component 106 (Shown in FIG. 1 and described herein).

At operation 208, one or more groupings of matched simulated wells within the simulated subsurface region may be identified based on the similarity maps, the spatial arrangement of the wells, and/or other information. Individual groupings of matched simulated wells may include a matched simulated well for individual ones of the wells. The grouping(s) of matched simulated wells may include a first grouping of matched simulated wells and/or other groupings of matched simulated wells. The first grouping of matched simulated wells may include the first simulated well matched to the first well, the second simulated well matched to the second well, and/or other simulated wells matched to other wells. In some implementation, operation 208 may be performed by a processor component the same as or similar to the matched simulated well component 108 (Shown in FIG. 1 and described herein).

At operation 210, correlation between the wells may be determined based on the simulated correlation between the matched simulated wells and/or other information. Correlation between the first well and the second well may be determined based on the simulated correlation between the first simulated well and the second simulated well, and/or other information. In some implementation, operation 210 may be performed by a processor component the same as or similar to the correlation component 110 (Shown in FIG. 1 and described herein).

Although the system(s) and/or method(s) of this disclosure have been described in detail for the purpose of illustration based on what is currently considered to be the most practical and preferred implementations, it is to be understood that such detail is solely for that purpose and that the disclosure is not limited to the disclosed implementations, but, on the contrary, is intended to cover modifications and equivalent arrangements that are within the spirit and scope of the appended claims. For example, it is to be understood that the present disclosure contemplates that, to the extent possible, one or more features of any implementation can be combined with one or more features of any other implementation.

What is claimed is:

1. A system for correlating multiple wells, the system comprising:
one or more physical processors configured by machine-readable instructions to:
obtain subsurface representation information defining a subsurface representation, the subsurface representation defining simulated subsurface configuration of a simulated subsurface region including simulated wells, the simulated wells including a first simulated well and a second simulated well, the simulated subsurface configuration of the simulated subsurface region defining simulated correlation between the simulated wells such that the simulated subsurface configuration of the simulated subsurface region defines first simulated correlation between the first simulated well and the second simulated well;
obtain well information, the well information defining subsurface configuration of wells and spatial arrangement of the wells, the wells including a first well and a second well, and the spatial arrangement of the first well and the second well including the first well separated from the second well by a first distance;

generate similarity maps for the wells based on comparison of the subsurface configuration of the wells with the simulated subsurface configuration of the simulated subsurface region, individual similarity maps characterizing extent of similarity between individual ones of the wells and different locations within the simulated subsurface region, wherein the individual similarity maps characterizing the extent of similarity between the individual ones of the wells and the different locations within the simulated subsurface region includes the individual similarity maps including similarity measures or similarity scores to indicate quantity and/or quality of matching between the individual ones of the wells and the different locations within the simulated subsurface region, the similarity maps including a first similarity map for the first well and a second similarity map for the second well;

identify one or more groupings of matched simulated wells within the simulated subsurface region based on the similarity maps and the spatial arrangement of the wells, individual groupings including a matched simulated well for individual ones of the wells, wherein the one or more groupings of matched simulated wells include a first grouping of matched simulated wells, the first grouping of matched simulated wells including the first simulated well matched to the first well and the second simulated well matched to the second well; and determine correlation between the wells based on the simulated correlation between the matched simulated wells, wherein first correlation between the first well and the second well is determined based on the first simulated correlation between the first simulated well and the second simulated well.

2. The system of claim 1, wherein the subsurface representation includes a computational stratigraphy model representation, and the correlation between the wells include chrono-sequence stratigraphic correlation.

3. The system of claim 1, wherein identification of the one or more groupings of matched simulated wells within the simulated subsurface region based on the similarity maps and the spatial arrangement of the wells includes determination of portions of the similarity maps within which the matched simulated wells are identified based on thresholding of the extent of similarity between the individual ones of the wells and the different locations within the simulated subsurface region, the portions of similarity maps including a first portion of the first similarity map and a second portion of the second similarity map.

4. The system of claim 3, wherein the first simulated well is located within the first portion of the first similarity map and the second simulated well is located within the second portion of the second similarity map, and a first simulated distance between the first simulated well and the second simulate well matches the first distance between the first well and the second well.

5. The system of claim 4, wherein the first simulated distance matches the first distance based on the first simulated distance being within a tolerance distance of the first distance.

6. The system of claim 1, wherein:
the wells include more than two wells;
the spatial arrangement of the wells includes relative positions of the wells, and
the one or more groupings of matched simulated wells are identified based on the relative positions of the wells.

7. The system of claim 1, wherein:
multiple groupings of matched simulated wells are identified within the simulated subsurface region; and
individual grouping of matched simulated wells provides a scenario of correlation between the wells.

8. The system of claim 7, wherein matching quality of the individual grouping of matched simulated wells is determined based on extent of matching of the matched simulated wells with corresponding wells and extent of matching of simulated spatial arrangement of the matched simulated wells with the spatial arrangement of the wells.

9. The system of claim 1, wherein:
the subsurface representation information defines multiple subsurface representations; and
individual ones of the subsurface representations are used to provide separate set of correlation between the wells.

10. The system of claim 1, wherein the subsurface representation is scaled in area size and thickness to match a subsurface region of interest.

11. A method for correlating multiple wells, the method comprising:
obtaining subsurface representation information defining a subsurface representation, the subsurface representation defining simulated subsurface configuration of a simulated subsurface region including simulated wells, the simulated wells including a first simulated well and a second simulated well, the simulated subsurface configuration of the simulated subsurface region defining simulated correlation between the simulated wells such that the simulated subsurface configuration of the simulated subsurface region defines first simulated correlation between the first simulated well and the second simulated well;

obtaining well information, the well information defining subsurface configuration of wells and spatial arrangement of the wells, the wells including a first well and a second well, and the spatial arrangement of the first well and the second well including the first well separated from the second well by a first distance;

generating similarity maps for the wells based on comparison of the subsurface configuration of the wells with the simulated subsurface configuration of the simulated subsurface region, individual similarity maps characterizing extent of similarity between individual ones of the wells and different locations within the simulated subsurface region, wherein the individual similarity maps characterizing the extent of similarity between the individual ones of the wells and the different locations within the simulated subsurface region includes the individual similarity maps including similarity measures or similarity scores to indicate quantity and/or quality of matching between the individual ones of the wells and the different locations within the simulated subsurface region, the similarity maps including a first similarity map for the first well and a second similarity map for the second well;

identifying one or more groupings of matched simulated wells within the simulated subsurface region based on the similarity maps and the spatial arrangement of the wells, individual groupings including a matched simulated well for individual ones of the wells, wherein the one or more groupings of matched simulated wells include a first grouping of matched simulated wells, the first grouping of matched simulated wells including the first simulated well matched to the first well and the second simulated well matched to the second well; and determining correlation between the wells based on the simulated correlation between the matched simulated wells, wherein first correlation between the first well and the second well is determined based on the first simulated correlation between the first simulated well and the second simulated well.

12. The method of claim 11, wherein the subsurface representation includes a computational stratigraphy model representation, and the correlation between the wells include chrono-sequence stratigraphic correlation.

13. The method of claim 11, wherein identifying the one or more groupings of matched simulated wells within the simulated subsurface region based on the similarity maps and the spatial arrangement of the wells includes determining portions of the similarity maps within which the matched simulated wells are identified based on thresholding of the extent of similarity between the individual ones of the wells and the different locations within the simulated subsurface region, the portions of similarity maps including a first portion of the first similarity map and a second portion of the second similarity map.

14. The method of claim 13, wherein the first simulated well is located within the first portion of the first similarity map and the second simulated well is located within the second portion of the second similarity map, and a first simulated distance between the first simulated well and the second simulate well matches the first distance between the first well and the second well.

15. The method of claim 14, wherein the first simulated distance matches the first distance based on the first simulated distance being within a tolerance distance of the first distance.

16. The method of claim 11, wherein:
the wells include more than two wells;
the spatial arrangement of the wells includes relative positions of the wells, and
the one or more groupings of matched simulated wells are identified based on the relative positions of the wells.

17. The method of claim 11, wherein:
multiple groupings of matched simulated wells are identified within the simulated subsurface region; and
individual grouping of matched simulated wells provides a scenario of correlation between the wells.

18. The method of claim 17, wherein matching quality of the individual grouping of matched simulated wells is determined based on extent of matching of the matched simulated wells with corresponding wells and extent of matching of simulated spatial arrangement of the matched simulated wells with the spatial arrangement of the wells.

19. The method of claim 11, wherein:
the subsurface representation information defines multiple subsurface representations; and
individual ones of the subsurface representations are used to provide separate set of correlation between the wells.

20. The method of claim 11, wherein the subsurface representation is scaled in area size and thickness to match a subsurface region of interest.

* * * * *